(12) United States Patent
Frutschy et al.

(10) Patent No.: US 6,975,518 B2
(45) Date of Patent: Dec. 13, 2005

(54) PRINTED CIRCUIT BOARD HOUSING CLAMP

(75) Inventors: Kristopher Frutschy, Phoenix, AZ (US); Glenn E. Stewart, Mesa, AZ (US); Farzaneh Yahyaei-Moayyed, Chandler, AZ (US); Geoffrey L. Reid, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/446,462

(22) Filed: May 28, 2003

(65) Prior Publication Data

US 2003/0173111 A1 Sep. 18, 2003

Related U.S. Application Data

(62) Division of application No. 09/896,409, filed on Jun. 29, 2001, now Pat. No. 6,586,684.

(51) Int. Cl.[7] ........................... H05K 7/10; H05K 7/12; H05K 3/30
(52) U.S. Cl. ...................... 361/769; 361/760; 361/787; 361/803; 29/832
(58) Field of Search .................. 361/732, 740, 361/747, 760, 767, 769, 784, 785, 786, 787, 361/790, 791, 770, 772, 774, 795, 796, 803; 174/260, 261; 29/592.1, 825, 832, 854

(56) References Cited

U.S. PATENT DOCUMENTS 3,795,037 A * 3/1974 Luttmer ...................... 29/628
3,954,317 A * 5/1976 Gilissen et al. ............ 339/17 E
4,330,163 A * 5/1982 Aikens et al. ................ 439/71
4,504,886 A * 3/1985 Cygan et al. ................ 361/721
4,793,814 A * 12/1988 Zifcak et al. ................. 439/66
4,882,657 A * 11/1989 Braun ........................ 361/412
4,991,666 A * 2/1991 Septfons et al. ............. 174/261
5,006,922 A * 4/1991 McShane et al. ............. 357/74
5,061,192 A * 10/1991 Chapin et al. ................ 439/66
5,324,205 A * 6/1994 Ahmad et al. ................ 439/66
5,395,252 A * 3/1995 White ......................... 439/66
5,479,319 A * 12/1995 Werther ..................... 361/784
5,699,229 A * 12/1997 Brownell ................... 361/719
5,953,214 A * 9/1999 Dranchak et al. ........... 361/767
6,777,319 B2 * 8/2004 Grube et al. ................ 438/612

* cited by examiner

*Primary Examiner*—Phuong T. Vu
(74) *Attorney, Agent, or Firm*—Schwegman, Lundberg, Woessner & Kluth, P.A.

(57) ABSTRACT

An electronic assembly includes one or more conductive clamps (302, 304, FIG. 3), which are used to supply current to an integrated circuit (IC) package (308). The conductive clamps are attached to a printed circuit (PC) board (312), which supplies the current to the IC package over one clamp, and receives returned current from the IC package over another clamp. Each clamp contacts a contact pad (330) on the surface of the PC board, and contacts another contact pad (334) on the top surface of the IC package. Vias (338, 339) and conductive planes (340, 342) within the package then carry current to and from an IC (e.g., IC 306) connected to the package. In another embodiment, the clamp (904, FIG. 9) holds a conductive structure (902) in place between the PC board contact pad (908) and the IC package contact pad (914), and current is carried primarily over the conductive structure, rather than over the clamp.

21 Claims, 10 Drawing Sheets

PRINTED CIRCUIT BOARD HOUSING CLAMP

This application is a divisional of U.S. patent application Ser. No. 09/896,409, filed Jun. 29, 2001, now issued as U.S. Pat. No. 6,586,684, which is incorporated herein by reference.

TECHNICAL FIELD OF THE INVENTION

The present invention relates generally to apparatus for providing current to an electronic circuit housing, and more particularly to providing high currents to an integrated circuit package through a clamp, and methods of manufacturing a clamp and an electronic assembly, which includes a clamp.

BACKGROUND OF THE INVENTION

Electronic circuits, and particularly computer and instrumentation circuits, have in recent years become increasingly powerful and fast. As these circuits become faster, and the currents they require also continue to increase. In some cases, integrated circuits (ICs) are requiring currents of up to 100 amps, and future ICs will likely require substantially more current.

Figure 1:
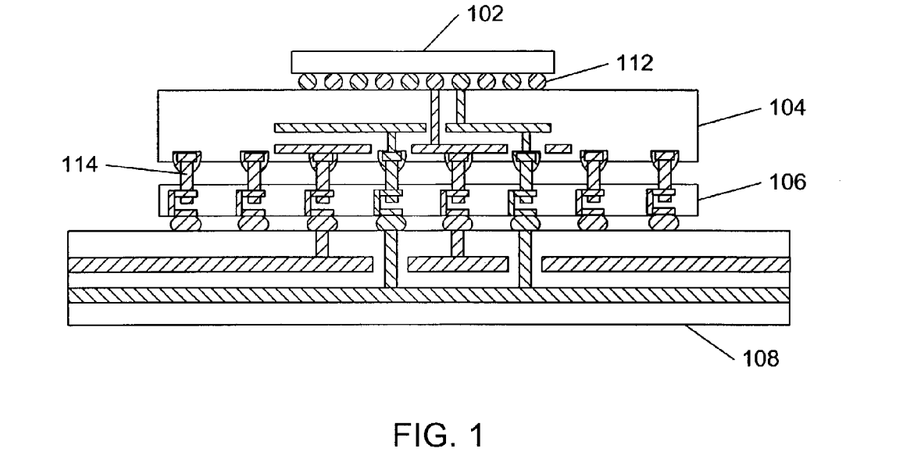
FIG. 1 illustrates a cross-section of an electronic assembly in which power is supplied and returned through pins, in accordance with the prior art.

Using prior art technologies, current is supplied to the IC's package through connectors (e.g., pins, solder balls, etc.) located on the bottom surface of the package. FIG. 1 illustrates a cross-section of an electronic assembly in which power is supplied and returned through pins, in accordance with the prior art. The assembly includes IC 102, IC package 104, socket 106, and PC board 108.

IC 102 contains one or more circuits, which require current to operate. IC 102 is electrically and mechanically connected to the top surface of IC package 104, typically using wire-bond (not shown) or solder connections 112.

IC package 104, in turn, is electrically and mechanically coupled to the top surface of socket 106 using bottom connectors, such as pins 114, which mate with complementary pin holes within socket 106. Alternatively, IC package 104 could be coupled to socket 106 using solder connections, such as land grid array (LGA) or ball grid array (BGA) connections, for example. Connectors 114 are used to supply and return current to and from IC package 104, and also to carry input/output (I/O) signals to and from the package 104.

PC board 108 could be, for example, a motherboard of a computer or other electronic system. As such, it acts as a vehicle to supply power, ground, and I/O signals to integrated circuit 102. These power, ground, and other signals are supplied through traces or planes (not shown) on or within PC board 108, socket 106, connectors 114, and IC package 104.

Often, a large number of the package's connectors (e.g., pins 114) are dedicated to supplying and returning current. For example, a typical package may have 300 of 500 connectors dedicated to current supply and return, leaving only about 200 connectors for I/O signals. The current carrying capacity of the package is limited by the cumulative cross sectional area of the current carrying connectors (e.g., the cross sectional area of the current carrying pins). If the current becomes too high, some or all of the current carrying connectors may permanently fail, resulting in a partial or full loss of IC functionality.

One prior art solution to the need for more power is to increase the number of connectors dedicated to power delivery. However, this solution further limits the number of connectors that can be dedicated to I/O signals. In order to provide more connectors for power and/or I/O signals, the connector count must be increased, thus increasing the package size. Package size increases typically are undesirable in most applications, because larger packages reduce IC device speeds due to increased inductance, and because of the consumer-driven trend within industry is to reduce the size of electronic systems.

Figure 2:
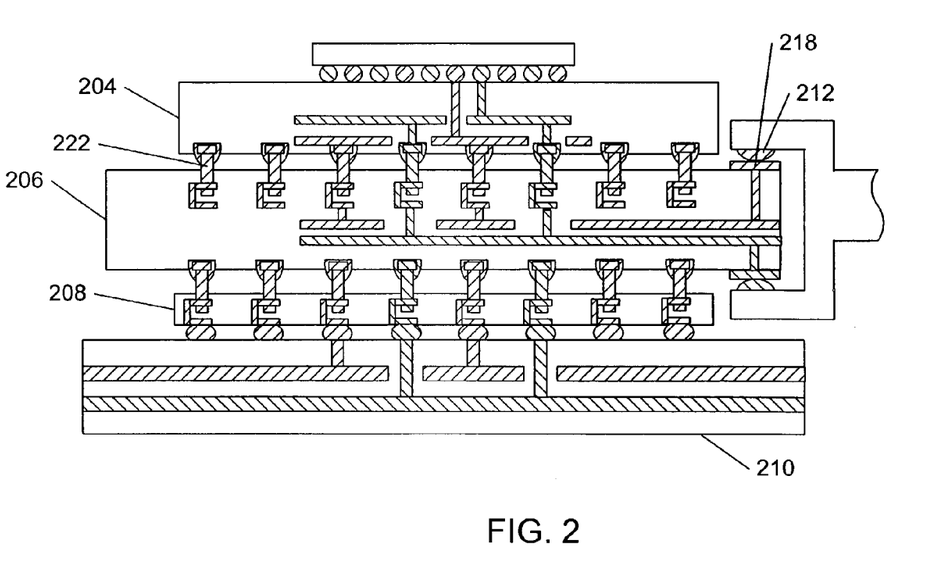
FIG. 2 illustrates a cross-section of an electronic assembly in which power is supplied and returned through a power pod connector, in accordance with the prior art.

In some cases, power is supplied to a package from a power pod, through an edge connector of an interposer (i.e., a substrate that provides a dimensional interface between connectors on a package and connectors on a socket or printed circuit board) upon which the package is mounted. A power pod is an additional power supply that typically supplies power to one device within a system, as opposed to supplying power to the entire system. That power is transmitted from the interposer to the package through the package's bottom connectors. FIG. 2 illustrates a cross-section of an electronic assembly in which power is supplied and returned through a power pod connector 202, in accordance with the prior art. The assembly illustrated in FIG. 2 is similar to the assembly illustrated in FIG. 1, except that the IC package 204 is electrically and mechanically connected to an interposer 206, which in turn connects to a socket 208 mounted on PC board 210.

The power pod connector 202 can be a clamp with conductive surfaces 212, 214 on the insides of two opposing jaws 216. When engaged with the interposer 206, the conductive surface 212 on one jaw makes contact with a conductive plane 218 on the top surface of the interposer 206, while the conductive surface 214 on the opposing jaw makes contact with another conductive plane 220 on the bottom surface of the interposer 206. One conductive plane supplies current, while the other conductive plane returns current. This current travels from the conductive planes through vias and conductive layers within interposer 206, to the package's connectors 222.

Although higher currents can be supplied using a power pod, the current must still travel from the interposer through the package's connectors 222. Thus, the supplied current is relatively far from the IC, and the amount of current supplied to the package 204 is still limited by the cumulative cross sectional area of those connectors (e.g., pins 222), which are dedicated to power delivery. In addition, the conductive surfaces of a typical power pod connector do not connect to the interposer's conductive planes with a high normal force. Accordingly, a non-negligible contact resistance is associated with the power pod, resulting in the power pod connector consuming a certain portion of the supplied power.

As the power requirements for ICs continue to increase, there is a need for power delivery apparatus that can supply higher currents than are possible using prior art technologies. In addition, what is needed is a power delivery apparatus that enables more package connectors to be dedicated to I/O signals, rather than to power supply and return, without increasing the package size. Further needed is a power delivery apparatus that supplies current closer to the IC and with a lower contact resistance than is possible using prior art, power pod connector solutions.

DETAILED DESCRIPTION OF THE INVENTION

The various embodiments of the invention can be used to supply higher currents to a housing (e.g., a printed circuit board, interposer or electronic circuit package) than is possible using prior art technologies. In addition, the various embodiments enable more connectors on the bottom surface of the housing to be dedicated to purposes (e.g., I/O signals) other than power delivery without increasing housing size. Also, the various embodiments enable current to be supplied closer to an integrated circuit, resulting in reduced inductance and lower contact resistance than is possible using prior art, power pod solutions.

Various embodiments of the present invention provide a clamp, which attaches to a substrate and contacts a portion of the top surface of a housing. In one embodiment, the clamp includes a contact plate, which attaches to the substrate, a spring arm, which extends in an upward direction from the substrate, and a contact flange, which compresses against the top surface of the housing.

The clamp is electrically conductive, in one embodiment, and current flows from a conductive pad on the substrate, through the clamp, to a conductive pad on the housing, or vice versa. In another embodiment, the clamp is used to compress one end of a conductive structure against a conductive pad on the substrate, and compress another end of the conductive structure against a conductive pad on the housing, where the current is carried substantially through the conductive structure.

Further provided is an electronic assembly, which includes one or more clamps as described above. In one embodiment, two such clamps are included, where one clamp is used to supply current to a housing, and the other clamp is used to return the current from the housing.

Figure 3:
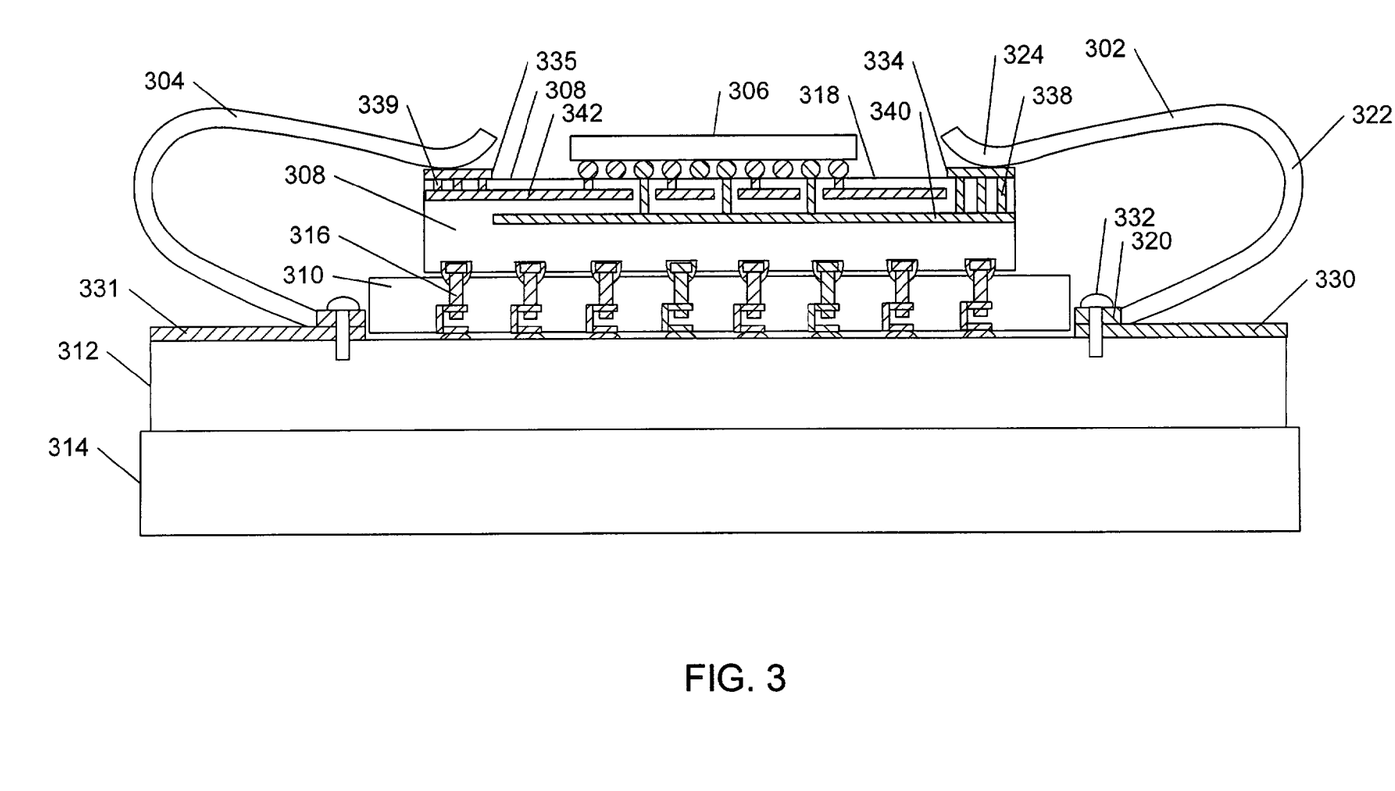
FIG. 3 illustrates a cross-section of an electronic assembly in which power is supplied and returned through clamps, in accordance with one embodiment of the present invention.

FIG. 3 illustrates a cross-section of an electronic assembly in which power is supplied and returned through clamps 302, 304, in accordance with one embodiment of the present invention. The assembly includes clamps 302, 304, integrated circuit (IC) 306, IC package 308, socket 310, PC board 312, and stiffening plate 314. Starting from the top of FIG. 3, IC 306 is housed by IC package 308. IC 306 contains one or more circuits, which are electrically connected to conductive structures within IC package 308 through connectors, such as ball grid array connectors.

IC 306 could be any of a number of types of integrated circuits. In one embodiment of the present invention, IC 306 is a microprocessor. In other embodiments, IC 306 could be a memory device, application specific integrated circuit, digital signal processor, or another type of device. In the example shown, IC 306 is a "flip chip" type of integrated circuit, meaning that the input/output terminations on the chip can occur at any point on its surface. After the chip has been readied for attachment to IC package 308, it is flipped over and attached, via solder bumps or balls to matching pads on the top surface of IC package 308. Alternatively, IC 306 could be wire bonded to IC package 308, where I/O and power terminations are connected to IC package 308 using bond wires to pads on the top surface of IC package 308, or otherwise connected to package 308.

IC package 308 is electrically coupled to socket 310 through connectors. In the configuration shown, IC package 308 includes pins 316, which mate with complementary pin holes in socket 310. In other embodiments, IC package 308 is electrically coupled to socket 310 using ball grid or land grid array connections. In still other embodiments, IC package 308 is electrically coupled to an interposer (not shown), which in turn connects to a socket through pinned or soldered connections.

Socket 310 connects to PC board 312 using soldered or pinned connections. In one embodiment, a stiffening plate 314 is attached to PC board 312 in order to provide increased mechanical stability to PC board 312. In another embodiment, no stiffening plate is used to provide such stability.

PC board 312 could be, for example, a motherboard of a computer or other electronic system. PC board 312 acts as a vehicle to supply I/O signals to IC 306. In one embodiment, the I/O signals are supplied through traces or planes and other conductive structures on or within PC board 312, socket 310, and IC package 308. For ease of illustration, most of the conductive structures associated with I/O signals are not depicted in FIG. 3.

In addition, PC board 312 supplies and returns power to one or more of the circuits within IC 306. Some or all of this power is supplied and/or returned, in one embodiment of the present invention, through one or more clamps 302, 304, which are attached to PC board 312 and which contact the top surface 318 of IC package 308. By supplying and/or returning some or all of the power through clamps 302, 304, more of the IC package's pins 316 (or other bottom surface connectors) can be dedicated to I/O signals, rather than to power and ground.

In one embodiment, each clamp 302, 304 is formed from one or more conductive materials, and includes a contact plate 320, a spring arm 322, and a contact flange 324. Contact plate 320 is attached to a contact pad 330 on the top surface of PC board 312 using one or more fasteners 332, in one embodiment. In various embodiments, fasteners 332 could be threaded fasteners (e.g., screws), rivets, clips or other types of fasteners. Alternatively, contact plate 320 could be attached to contact pad 330 using solder, adhesive, or some other type of material. Each contact pad 330 on PC board 312 is electrically connected to the supply or return terminals of a power supply (not shown), in one embodiment. The electrical connections could be direct, or they could be made through one or more intermediate conductive structures and/or circuits.

When clamp 302, 304 is attached to PC board 312, spring arm 322 extends upward from PC board 312, and contact flange 324 makes contact with another contact pad 334 on a portion of the top surface 318 of IC package 308. In one embodiment, each contact pad 334, 335 on IC package 308 is positioned on a distinct portion of the top surface. In one embodiment, each contact pad 334, 335 is located on a portion of the top surface that is relatively close to an edge of the IC package 308. Although only a single contact pad 334 or 335 is necessary to electrically connect each clamp 302 or 304 to IC package 308, multiple contact pads could be used to electrically connect each clamp 302 or 304 to IC package 308.

Each contact pad 334, 335 is electrically connected to one or more vias 338, 339, which extend from the portions of the top surface downward to one or more conductive planes 340, 342 within IC package 308, in one embodiment. Conductive planes 340, 342 act as either power or ground planes, each of which electrically connect to IC 306. Although only two conductive planes 340, 342 are shown in FIG. 3, indicating that IC package 308 includes only a single power plane and a single ground plane, multiple power and/or ground planes could be included within IC package.

During operation, current is supplied from PC board 312 to IC 306 through a first PC board contact pad 330, a first clamp 302, a first IC package contact pad 334, a first set of one or more vias 338, and a first conductive plane 340 (i.e., a power plane). Similarly, current is returned from the IC 306 to the PC board 312 through a second conductive plane 342 (i.e., a ground plane), a second set of one or more vias 339, a second IC package contact pad 335, a second clamp 304, and a second PC board contact pad 331.

Figure 4:
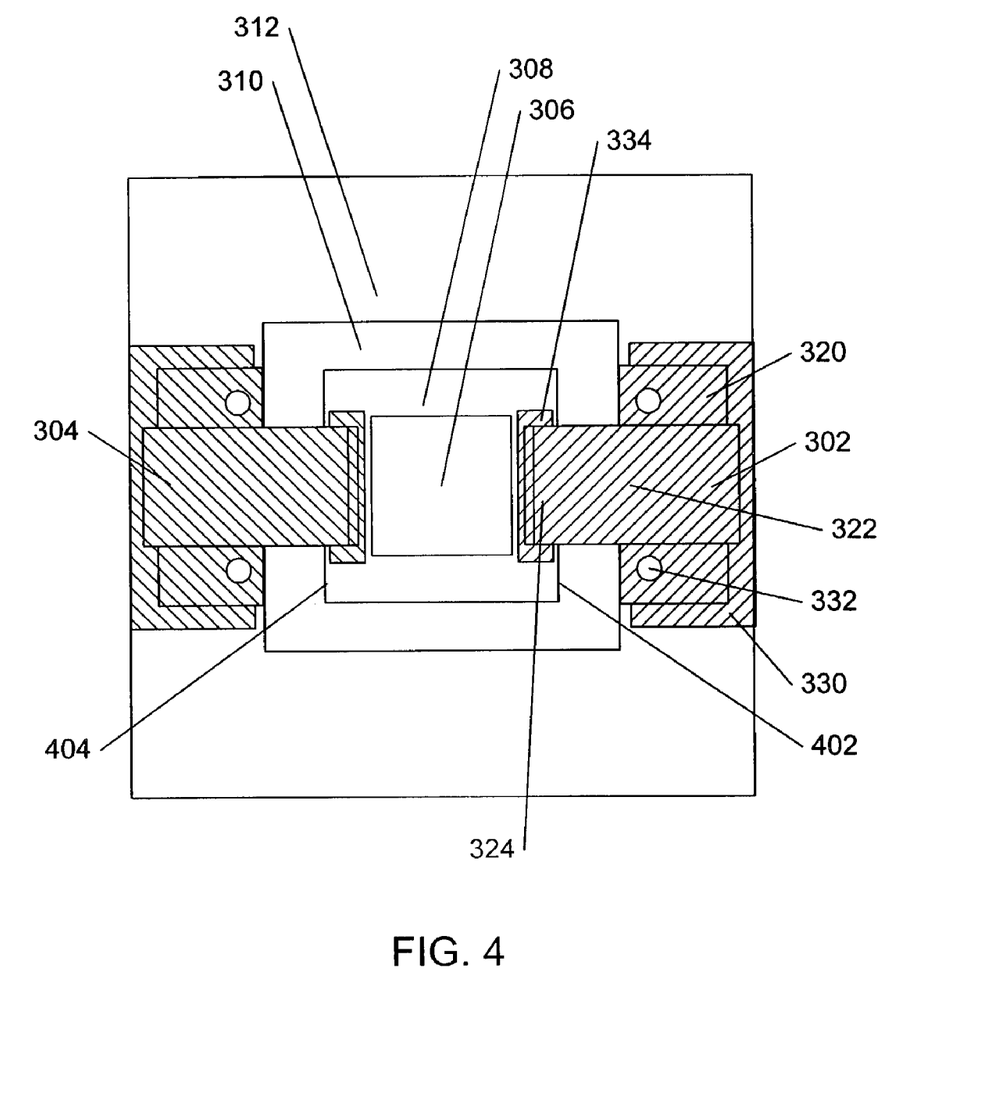
FIG. 4 illustrates a top view of the electronic assembly shown in FIG. 3.

FIG. 4 illustrates a top view of the electronic assembly shown in FIG. 3. The assembly includes clamps 302, 304, IC 306, IC package 308, socket 310, and PC board 312. The contact plate 320 of each clamp 302, 304 is attached to a PC board contact pad 330 using fasteners 332, in one embodiment. The spring arm 322 of each clamp 302, 304 extends from the PC board contact pad 330 toward an IC package contact pad 334, which is in electrical contact with a contact flange 324 of each clamp 302, 304. In one embodiment, clamps 302, 304 are positioned so that they contact portions of IC package 308 near opposite edges 402, 404 of IC package 308. In other embodiments, clamps are positioned so that they contact portions of IC package 308 near the same edge of IC package 308, or near perpendicular edges of IC package 308.

Figure 5:
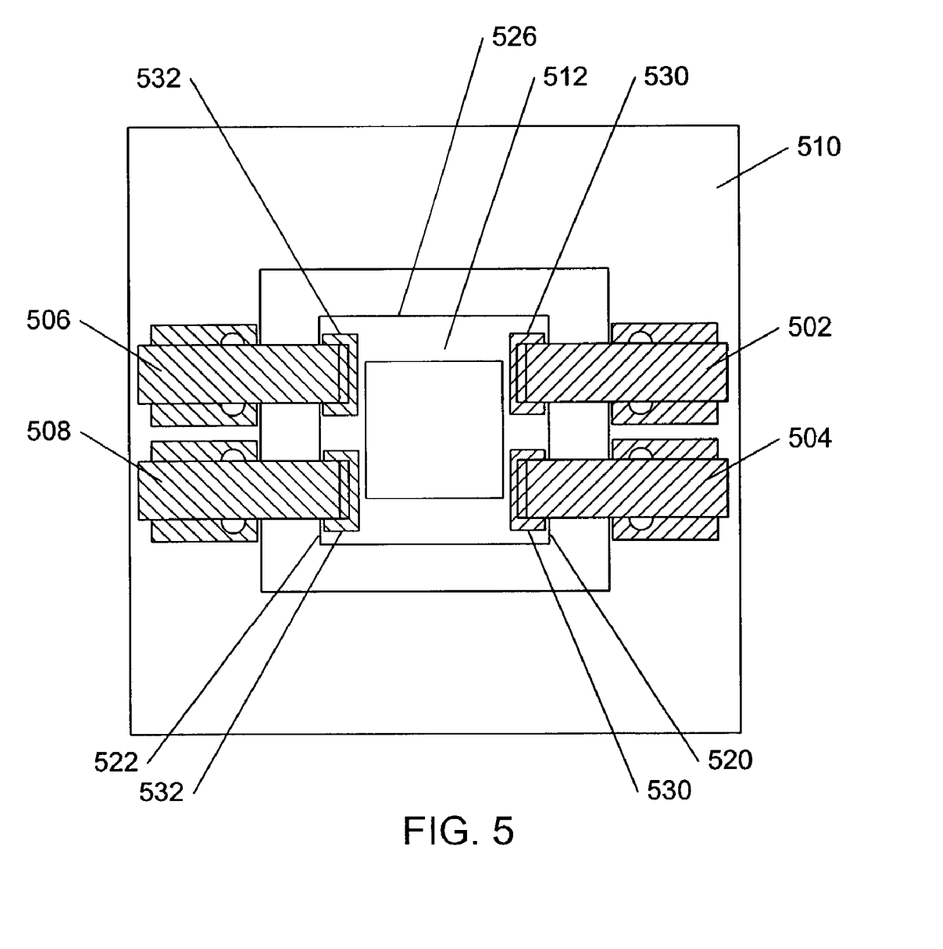
FIG. 5 illustrates a top view of an electronic assembly, in accordance with another embodiment of the present invention.

Although only two clamps 302, 304 are illustrated in the embodiment shown in FIG. 4, one or more additional clamps could be used to supply and return current between PC board 312 and IC package 308. For example, FIG. 5 illustrates a top view of an electronic assembly, in accordance with another embodiment of the present invention. In this embodiment, four clamps 502, 504, 506, 508 are connected between PC board 510 and IC package 512. In alternate embodiments, more or fewer than four clamps could be used.

When all current supply paths are near one edge 520 of IC package 512, and all current return paths are near the opposite edge 522 of IC package 512, the power delivery loop may be relatively large. In some cases, the loop area may cause the power delivery system to have undesirable inductance characteristics. In one embodiment, a first clamp (e.g., clamp 502) is used for current delivery and a second, adjacent clamp (e.g., clamp 504) is used for current return, where an adjacent clamp is defined as a clamp that is next to the first clamp. This configuration enables the area of the power delivery loop to be decreased, along with the inductance characteristic of the power delivery system. In various embodiments, multiple clamps could be used for either or both current delivery and return. For example, clamps 502, 506 could be used for current delivery, and clamps 504, 508 could be used for current return. Alternatively, adjacent clamps 502, 504 could be used for current delivery, and adjacent clamps 506, 508 could be used for current return.

In the embodiment shown in FIG. 5, adjacent clamps 502, 504 contact pads 530 located near a first edge 520 of IC package 512, and adjacent clamps 506, 508 contact pads 532 located near a second, opposite edge 522 of IC package 514. In alternate embodiments, adjacent clamps could contact pads located near perpendicular edges (e.g., edges 520, 526) of IC package 512. In addition, in various embodiments, clamps could contact pads located near one, two, three or four edges of the IC package.

Although clamps 302, 304 (FIGS. 3 and 4) and clamps 502–508 (FIG. 5) are shown to be attached between a PC board and an IC package, such clamps could also be attached between other types of substrates and housings. For ease of explanation, the description herein refers to attaching one end of the clamp (e.g., the contact plate) to a "substrate" and contacting the other end of the clamp (e.g., the contact flange) to a "housing." In various embodiments, either or both the substrate or the housing could be a PC board, interposer, IC or other type of electronic package, or an IC or other electrical device.

Figure 6:
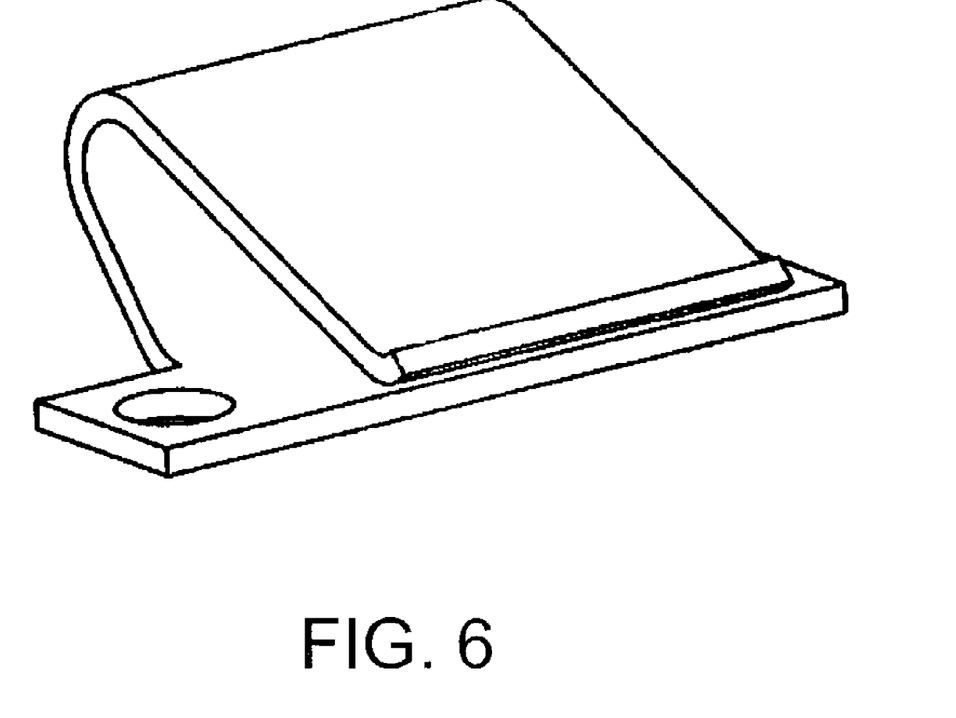
FIG. 6 illustrates a three dimensional view of a clamp, in accordance with one embodiment of the present invention.

FIG. 6 illustrates a three dimensional view of a clamp, in accordance with one embodiment of the present invention. In one embodiment, the clamp includes contact plate 602, spring arm 604, and contact flange 606. Contact plate 602, spring arm 604, and contact flange 606 could be integrally formed together, or they could be connected using various rigid connections (not shown).

In one embodiment, contact plate 602 includes one or more fastener openings 608, through which one or more fasteners (e.g., fasteners 332, FIG. 3) can be installed to attach contact plate 602 to a PC board (e.g., PC board 312, FIG. 3) or other substrate. Openings 608 are illustrated as circular in FIG. 6. In other embodiments, openings 608 could have other shapes, and/or could be located in different areas of contact plate 602. For example, a fastener opening 608 could be a notch at an edge of contact plate 602, which would facilitate attachment of a clip or other type of fastener. In addition, although two fastener openings 608 are illustrated, contact plate 602 could include more or fewer fastener openings. Alternatively, if contact plate 602 is attached to a substrate using solder, adhesive, or some other means of attachment, fastener openings 608 may not be present on contact plate 602.

Spring arm 604 is designed, in one embodiment, to provide a high normal force between the clamp and a contact pad on a housing, when the clamp is attached to a substrate. Spring arm 604 includes first arm member 610, curved member 612, and second arm member 614, in one embodiment. First arm member 610 extends from contact plate 602 in a first direction. When the clamp is attached to a substrate, the first direction is a direction upward from the substrate and away from the housing, in one embodiment. Curved member 612 attaches first arm member 610 and second arm member 614. Second arm member 614 extends from curved member 612 in a second direction. When the clamp is attached to a substrate, the second direction is a direction toward the housing and the contact flange 606.

In an alternate embodiment, the spring arm could have a different configuration. For example, the spring arm could include a single arm member that is curved or substantially straight. When the clamp is attached to a substrate, the single arm member would extend from the contact plate in a direction toward the housing. Alternatively, the spring arm could have more than two arm members.

The cross sectional area of the clamp, and particularly the spring arm 604, should be large enough to conduct a current within a range of 100–250 amps without failure, in one embodiment. This cross sectional area is defined by the width 620 and the thickness 622 of the clamp. In other embodiments, the cross sectional area could be designed to withstand currents that are higher or lower than the above range without failure.

Contact flange 606 is attached to spring arm 604, and includes a bottom surface 624 and an upwardly curving portion 626, in one embodiment. The bottom surface 624 makes contact with a contact pad on the housing, when the clamp is attached to the substrate. The upwardly curving portion 626 facilitates the contact of the bottom surface 624 of flange 606 with the contact pad during the attachment process. Essentially, while the clamp is being attached, the bottom surface of the upwardly curving portion compresses and scrubs against the contact pad, resulting in an increase in the contact surface area and a reduction in the contact resistance.

In one embodiment, contact plate 602, spring arm 604, and contact flange 606 are integrally formed a conductive bulk material such as, for example, copper, brass, steel or combinations of these or other conductive metals, alloys or other materials. Desirably, the conductive bulk material is capable of conducting large amounts of current without failure, and has a sufficient spring coefficient both to provide a high normal force on the housing contact pad and to avoid breaking when the clamp is attached to a substrate.

The conductive bulk material is coated, in one embodiment, with a conductive coating material such as, for example, gold, platinum or combinations of these or other conductive metals, alloys or other materials. Desirably, the conductive coating material is resistant to corrosion and provides a low contact resistance when the clamp is attached to a substrate.

Figure 7:
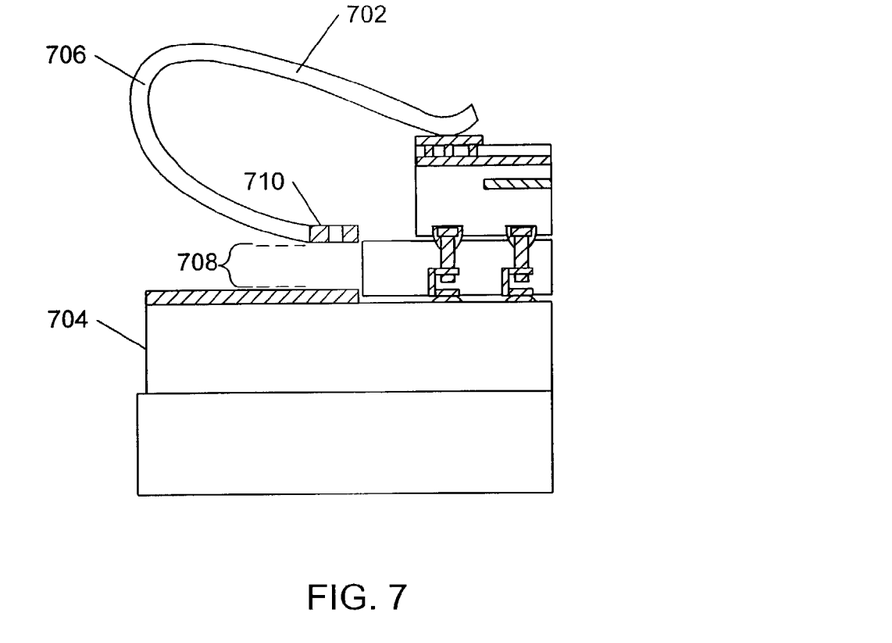
FIG. 7 illustrates a cross-section of a portion of an electronic assembly prior to clamp attachment, in accordance with one embodiment of the present invention.
Figure 8:
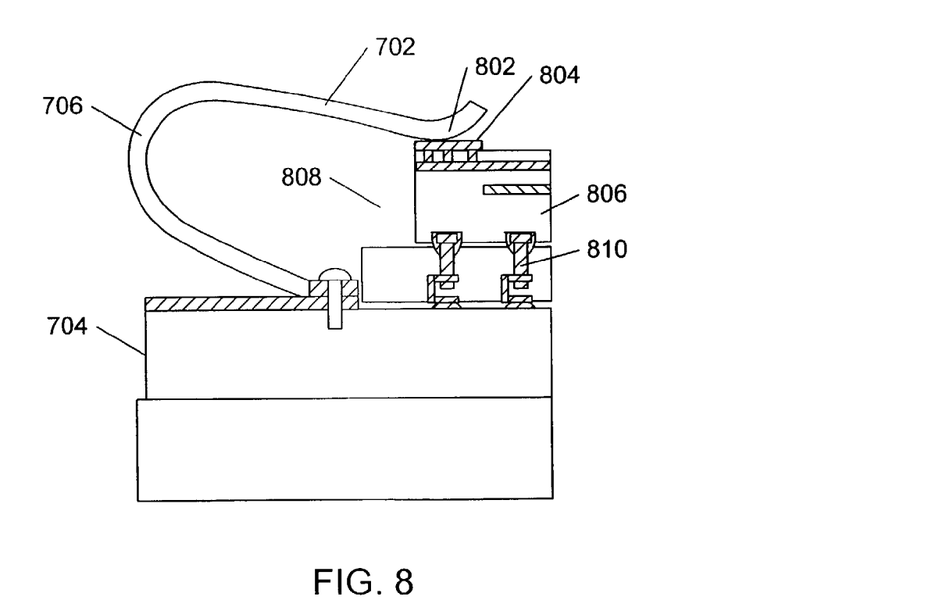
FIG. 8 illustrates a cross-section of a portion of an electronic assembly after clamp attachment, which shows how a clamp force is generated, in accordance with one embodiment of the present invention.

FIG. 7 illustrates a cross-section of a portion of an electronic assembly prior to clamp attachment, and FIG. 8 illustrates a cross-section of a portion of an electronic assembly after clamp attachment, in accordance with one embodiment of the present invention. Referring to FIG. 7, before clamp 702 is attached to substrate 704, the spring arm 706 is neither extended nor compressed, and a gap 708 exists between the contact plate 710 and the substrate 704, in one embodiment. Referring now to FIG. 8, after clamp 702 is attached to substrate 704, the spring arm 706 is extended, causing contact flange 802 to compress and scrub against contact pad 804 on the top surface of housing 806. By extending spring arm 706, contact flange 802 exerts a high normal force in a downward direction against contact pad 804, which results in a low contact resistance between clamp 702 and contact pad 804. In addition, the high normal force further compresses housing 806 into socket 808, thus facilitating the electrical connection of the housing's bottom connectors (e.g., pins 810) and the socket connectors. In another embodiment, where the housing and socket are a land grid array housing and socket, this high normal force facilitates the electrical connection between opposing contacts and may improve performance of the assembly.

The description, above, focuses on supplying and returning current through conductive clamps. Thus, the length of the current path from the power supply to the IC includes the length of the clamp's spring arm. In some cases, the length of the current path, when supplied through the conductive clamps, may result in undesirable inductance characteristics for the power supply system. In an alternate embodiment, these inductance characteristics can be reduced by providing a conductive structure, which is held in place by one or more clamps.

Figure 9:
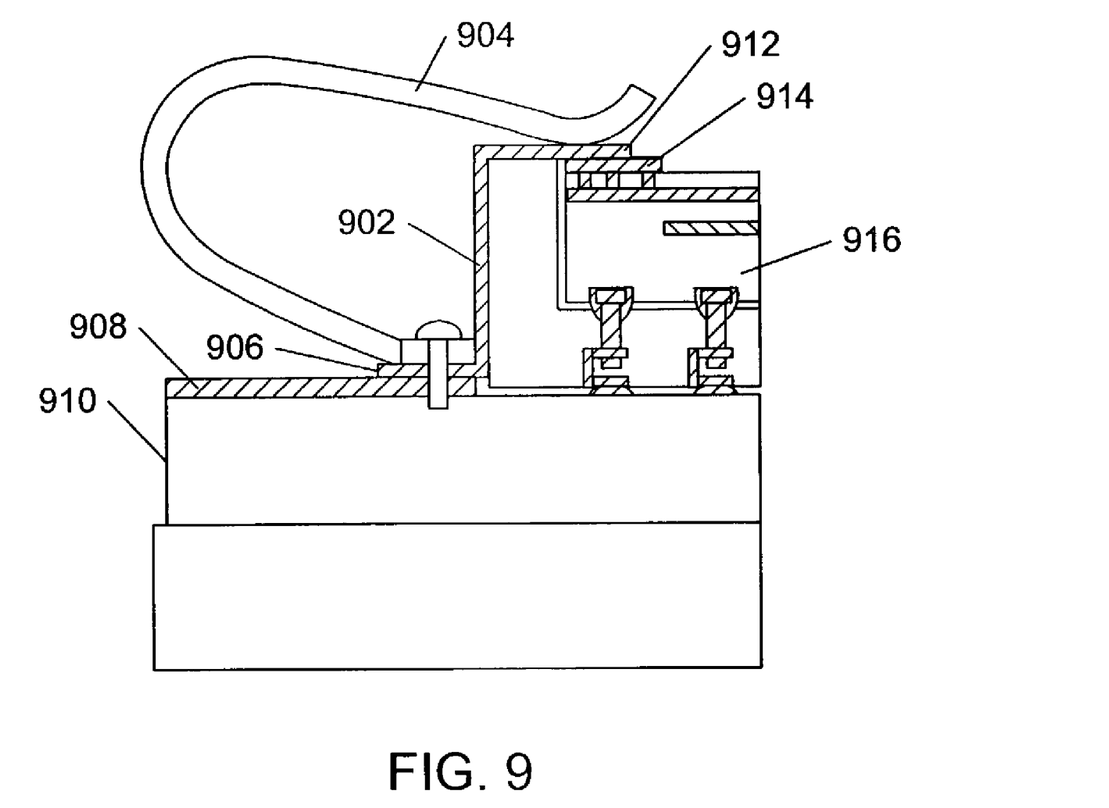
FIG. 9 illustrates a cross-section of an electronic circuit assembly in which power is supplied and returned through a conductive structure, which is held in place by a clamp, in accordance with another embodiment of the present invention.

FIG. 9 illustrates a cross-section of a portion of an electronic circuit assembly in which power is supplied and returned through a conductive structure 902, which is held in place by a clamp 904, in accordance with another embodiment of the present invention. In this embodiment, clamp 904 may be, but is not necessarily, formed from a conductive material, but its primary function is not to carry current. Instead, its primary function is to compress and hold a first end 906 of the conductive structure 902 in contact with a contact pad 908 on the surface of substrate 910, and to compress and hold a second end 912 of the conductive structure 902 in contact with a contact pad 914 on the top surface of housing 916. Accordingly, current is primarily carried between the housing 916 and the substrate 910 through the conductive structure 902. Because the length of conductive structure 902 can be made shorter than the length of the spring arm of clamp 904, the inductance associated with conductive structure 902 can be made less than the inductance associated with clamp 904.

In one embodiment, conductive structure 902 is formed from a flexible structure that includes multiple conductive paths that are electrically isolated from one another. For example, conductive structure 902 could be a ribbon cable. In such an embodiment, a first set of the conductive paths can be used to supply the current to the housing, and a second set of the conductive paths can be used to return the current from the housing. In such an embodiment, the supply and return current paths can be, but are not necessarily, made adjacent one another, thus further reducing the inductance characteristics of the power delivery system. In another embodiment, conductive structure 902 could be made only to supply or return current, but not both. In still another embodiment, conductive structure 902 could include only a single conductive path. In still another embodiment, conductive structure 902 is formed from a rigid material.

Figure 10:
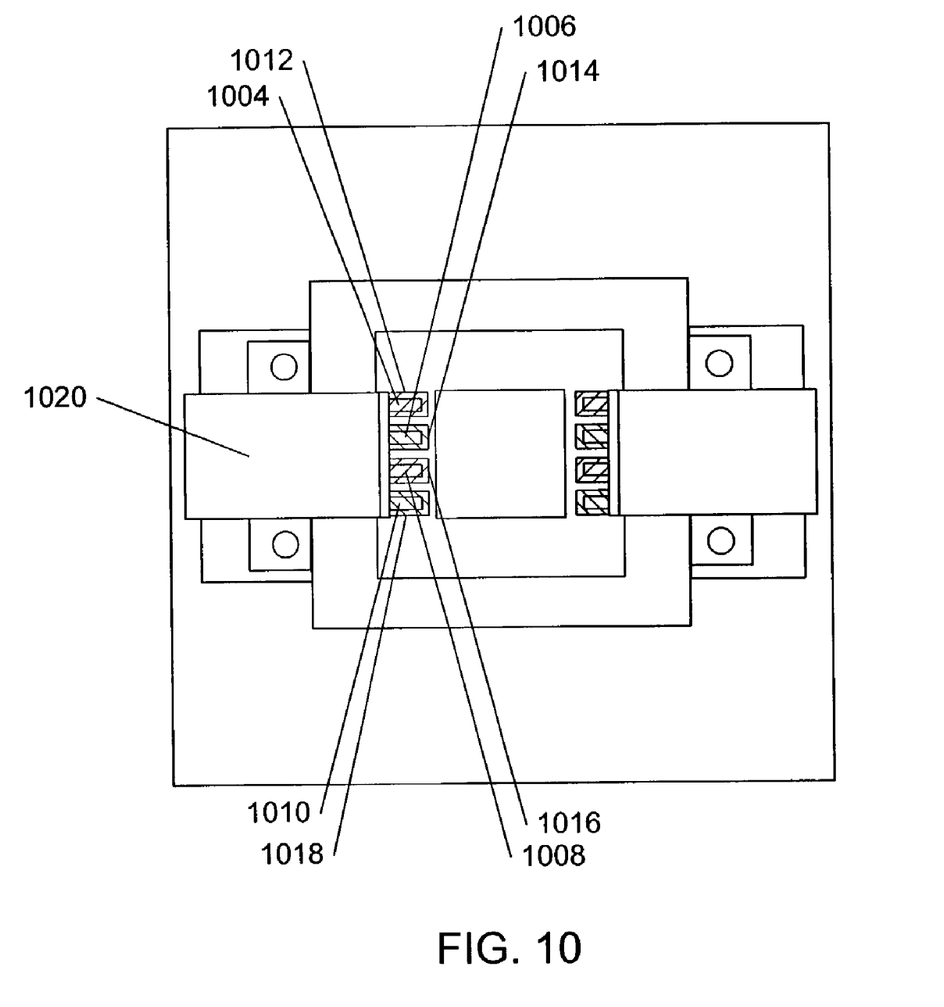
FIG. 10 illustrates a top view of one embodiment of the electronic assembly shown in FIG. 9, where the conductive structure includes multiple conductive paths.

FIG. 10 illustrates a top view of one embodiment of a portion of the electronic assembly shown in FIG. 9, where the conductive structure 1002 includes multiple conductive paths 1004, 1006, 1008, 1010. In one embodiment, the top surface of the housing includes multiple conductive contact pads 1012, 1014, 1016, 1018, each of which connects to one or more vias (not shown) and one or more conductive planes (not shown) within housing, as described previously.

In one embodiment, each of the multiple conductive paths 1004–1010 is held in contact with a conductive pad 1012–1018 by clamp 1020. In other embodiments, more than one conductive path could be held in contact with each conductive pad, or a single conductive path could be held in contact with multiple conductive pads. Although the pads 1012–1018 and the ends of conductive paths 1004–1010 are shown to extend beyond clamp 1020 for ease of illustration, the pads and/or conductive path ends could also be positioned underneath clamp 1020.

In one embodiment, adjacent conductive paths alternate between being dedicated to current supply and current return. Thus, for example, conductive paths 1004 and 1008 could be dedicated to current supply, and conductive paths 1006 and 1010 could be dedicated to current return. In alternate embodiments, all of the conductive paths 1004–1010 could be dedicated either to current supply or current return, but not both. Alternatively, the conductive paths dedicated to current supply and to current return might not strictly alternate. Although FIG. 9 illustrates only two clamps and eight conductive paths, additional clamps and conductive paths could be used along the same housing edge or adjacent housing edges, in various embodiments.

Figure 11:
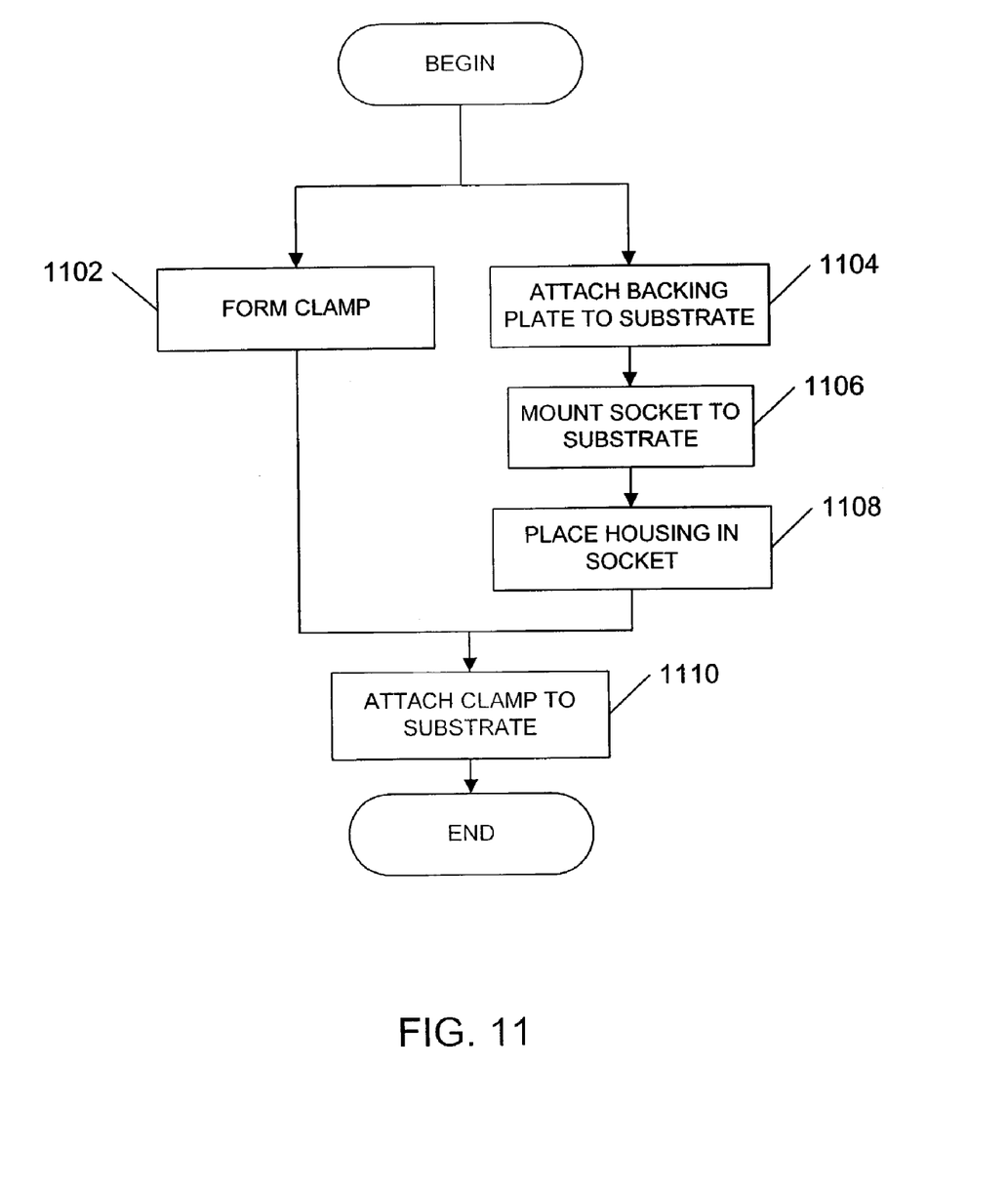
FIG. 11 illustrates a flowchart of a method for manufacturing an electronic assembly having clamps, in accordance with one embodiment of the present invention.

FIG. 11 illustrates a flowchart of a method for manufacturing an electronic assembly having clamps, in accordance with one embodiment of the present invention. The method begins, in block 1102, by forming a clamp (e.g., clamp 302, FIG. 3), which includes a contact plate, a spring arm, and a contact flange (e.g., plate 602, arm 604, flange 606, FIG. 6). In one embodiment, the clamp is formed by punching a pattern from a flat piece of conductive bulk material, bending the pattern to form the spring arm and the contact flange, and coating the contact plate, spring arm, and contact flange with a conductive coating material. In another embodiment, the clamp is not coated with a conductive material. In still another embodiment, the clamp is formed using a nonconductive material (e.g., in an embodiment that uses a separate conductive structure to conduct current, such as structure 902, FIG. 9).

In block 1104, which can occur before, during or after block 1102, a stiff backing plate (e.g., plate 314, FIG. 3) is attached to a bottom surface of a substrate (e.g., PC board 312, FIG. 3), to which the clamp will eventually be attached. Then, in block 1106, a socket (e.g., socket 310, FIG. 3) is mounted to the top surface of the substrate (e.g., using pins or solder connections). A housing (e.g., IC package 308, FIG. 3) is then placed in the socket, in block 1108.

After blocks 1102 and 1108 have been completed, the clamp's contact plate is attached to the substrate so that the contact flange compresses against a top surface of the housing, in block 1110. In one embodiment, the clamp is conductive, the contact plate is attached to a contact pad on the substrate's surface, and the contact flange compresses directly against a contact pad on the housing's surface. In this embodiment, current can be carried between the substrate and the housing over the clamp. In another embodiment, prior to attachment, one end of a conductive structure is placed between the contact plate and the substrate's contact pad, and a second end of the conductive structure is placed between the contact flange and the housing's contact pad. The clamp is then attached, and the conductive structure is used to carry current between the substrate and the housing.

In one embodiment, the clamp is attached to the substrate by installing one or more fasteners (e.g., fasteners 332, FIG. 3) into one or more fastener openings (e.g., openings 608, FIG. 6) on the contact plate. In another embodiment, the clamp is attached to the substrate using solder, adhesive or some other attachment means. After attaching one or more clamps to the substrate and in contact with the top surface of the housing, the method ends.

Figure 12:
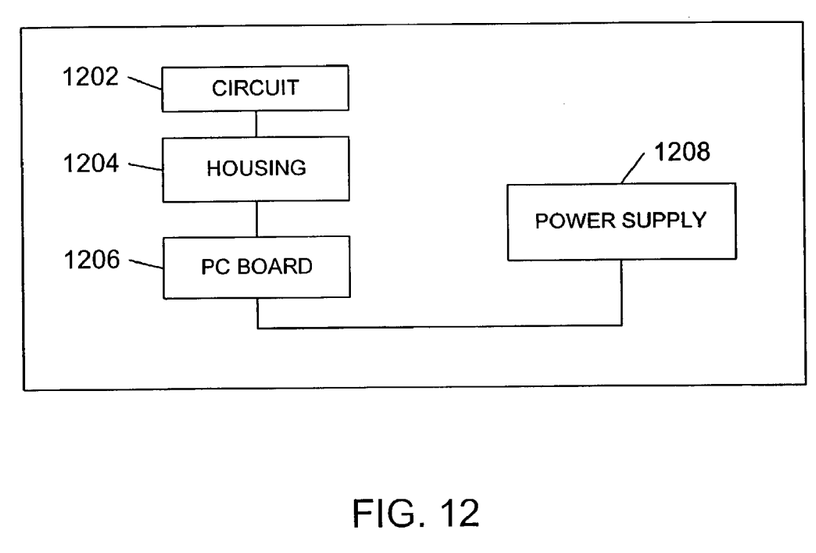
FIG. 12 illustrates an electronic system, in accordance with one embodiment of the present invention.

The configurations described above in conjunction with various embodiments could form part of an electronic system. FIG. 12 illustrates an electronic system, in accordance with one embodiment of the present invention.

The system shown in FIG. 12 could be, for example, a computer (e.g., a server or personal computer), a wireless or wired communication device (e.g., telephone, modem, cell phone, pager, radio, etc.), a television, a monitor, or virtually any other type of electronic system that could benefit from the use of the clamps described in conjunction with the various embodiments, above. In particular, high current and/or high power applications may benefit substantially from using the connectors of the various embodiments. The electronic system includes circuit 1202, housing 1204, PC board 1206, and power supply 1208. In addition, the electronic system may include a socket (not shown) within which housing 1204 is seated. Power supply 1208 supplies current to housing 1204 via PC board 1206 and one or more clamps or conductive structures (not shown), which are attached between PC board 1206 and the top surface of housing 1204, in accordance with various embodiments of the present invention.

CONCLUSION

Various embodiments of a clamp and an electronic assembly have been described, along with a description of manufacturing of the clamp and assembly, and the incorporation of the assembly within an electronic system. The various embodiments can be used to supply higher currents to electronic packages (and thus to electronic circuits) than is possible using prior art technologies. In addition, the various embodiments enable more package bottom connectors to be dedicated to I/O signals, without increasing the size of the package.

While the foregoing examples of dimensions and ranges are considered typical, the various embodiments of the invention are not limited to such dimensions or ranges. It is recognized that the trend within industry is to generally reduce device dimensions for the associated cost and performance benefits. In the foregoing detailed description, reference is made to the accompanying drawings, which form a part hereof, and in which are shown by way of illustration specific embodiments in which the invention may be practiced. These embodiments are described in sufficient detail to enable those skilled in the art to practice the invention.

It will be appreciated by those of ordinary skill in the art that any arrangement, which is calculated to achieve the same purpose, may be substituted for the specific embodiment shown. The various embodiments have been described in the context of supplying current to an integrated circuit package. One of ordinary skill in the art would understand, based on the description herein, that the method and apparatus of the present invention could also be applied in many other applications where supply of high currents is desired using clamps, such as those described in the various embodiments. Therefore, all such applications are intended to fall within the spirit and scope of the present invention.

This application is intended to cover any adaptations or variations of the present invention. The foregoing detailed description is, therefore, not to be taken in a limiting sense, and it will be readily understood by those skilled in the art that various other changes in the details, materials, and arrangements of the parts and steps, which have been described and illustrated in order to explain the nature of this invention, may be made without departing from the spirit and scope of the invention as expressed in the adjoining claims.

What is claimed is:

1. A clamp comprising:
   a contact plate, which is attachable to a top surface of a substrate;

a spring arm, connected to the contact plate, which extends upward from the substrate when the contact plate is attached to the substrate; and a contact flange, connected to the spring arm, which makes contact with and compresses against a first portion of a top surface of a housing when the contact plate is attached to the substrate, enabling current to flow between the substrate and the housing, wherein the contact plate, the spring arm, and the contact flange are integrally formed from a conductive bulk material, and wherein the conductive bulk material forming the contact plate, the spring arm, and the contact flange is coated with a conductive coating material.

2. The clamp as claimed in claim 1, wherein the conductive bulk material includes one or more materials selected from a group of materials that includes copper, brass, and steel.

3. The clamp as claimed in claim 1, wherein the conductive coating material includes one or more materials selected from a group of materials that includes gold and platinum.

4. The clamp as claimed in claim 1, wherein the spring arm comprises:

a first arm member, integrally attached to the contact plate, which extends from the contact plate in a first direction away from the housing, when the contact plate is attached to the substrate;

a curved member, integrally attached to the first arm member;

a second arm member, integrally attached to the curved member and the contact flange, which extends from the curved member in a second direction toward the housing and the contact flange, when the contact plate is attached to the substrate.

5. The clamp as claimed in claim 1, wherein a cross sectional area of the clamp is large enough to conduct a current within a range of 100–250 amps without failure.

6. A method for manufacturing an electronic assembly, the method comprising:

forming a clamp by punching a pattern from a flat piece of conductive material;

bending the pattern to form a spring arm and a contact flange;

connecting the spring arm to a contact plate, which is attachable to a top surface of a substrate, wherein the spring arm extends upward from the substrate when the contact plate is attached to the substrate;

connecting the contact flange to the spring arm, wherein the contact flange makes contact with a first portion of a top surface of a housing when the contact plate is attached to the substrate, enabling current to flow between the substrate and the housing; and coating the contact plate, the spring arm, and the contact flange with a conductive coating material.

7. The method as claimed in claim 6, wherein the contact plate, the spring arm, and the contact flange are formed from a conductive bulk material, which includes one or more materials selected from a group of materials that includes copper, brass, and steel.

8. The method as claimed in claim 6, wherein the conductive coating material includes one or more materials selected from a group of materials that includes gold and platinum.

9. The method as claimed in claim 6, further comprising:

installing one or more fasteners into one or more fastener openings in the contact plate in order to attach the first clamp to the substrate, wherein the contact flange makes contact with a conductive contact pad on the first portion of the top surface of the housing when the contact plate is attached to the substrate.

10. The method as claimed in claim 9, further comprising:

attaching a stiff backing plate to the substrate;

mounting a socket to the substrate; and placing the housing within the socket prior to installing the one or more fasteners.

11. A clamp comprising:

a conductive contact plate, which includes one or more fastener openings to facilitate connection of the contact plate to a top surface of a substrate;

a conductive spring arm, having a first end that is integrally connected to the conductive contact plate, which extends upward from the top surface of the substrate when the conductive contact plate is connected to the substrate; and a conductive contact flange, integrally connected to a second end of the conductive spring arm, which is compressible against a first portion of a top surface of a housing, which is directly or indirectly coupled to the top surface of the substrate, when the conductive contact plate is connected to the substrate, enabling current to flow between the substrate and the housing through the conductive contact plate, the conductive spring arm, and the conductive contact flange, wherein the conductive contact plate, the conductive spring arm, and the conductive contact flange are coated with a conductive coating material.

12. The clamp as claimed in claim 11, wherein the conductive spring arm comprises:

a first arm member, integrally attached to the conductive contact plate, which extends from the conductive contact plate in a first direction away from the housing, when the conductive contact plate is attached to the substrate;

a curved member, having a first end that is integrally attached to the first arm member;

a second arm member, integrally attached to a second end of the curved member and the conductive contact flange, which extends from the curved member in a second direction toward the housing and the conductive contact flange, when the conductive contact plate is attached to the substrate.

13. The clamp as claimed in claim 11, wherein a cross sectional area of the clamp is large enough to conduct a current of up to 100 amps without failure.

14. The clamp as claimed in claim 11, wherein a cross sectional area of the clamp is large enough to conduct a current within a range of 100–250 amps without failure.

15. The clamp as claimed in claim 11, wherein a cross sectional area of the clamp is large enough to conduct a current within a range of greater than 250 amps without failure.

16. The clamp as claimed in claim 11, wherein the conductive contact plate, the conductive spring arm, and the conductive contact flange include one or more materials selected from a group of materials that includes copper, brass, and steel.

17. A clamp comprising:

a conductive contact plate;

a conductive spring arm, having a first end that is integrally connected to the conductive contact plate; and a conductive contact flange, integrally connected to a second end of the conductive spring arm, wherein the conductive contact plate, the conductive spring arm, and the conductive flange are configured so that, during connection of the conductive contact plate to a substrate that includes a housing, which is directly or indirectly coupled to the top surface of the substrate, the conductive flange compresses against a top surface of the housing, causing the conductive spring arm to be extended, and causing the conductive contact flange to exert a high normal force in a downward direction against the top surface of the housing, wherein the conductive contact plate, the conductive spring arm, and the conductive contact flange are coated with a conductive coating material.

18. The clamp as claimed in claim 17, wherein the conductive contact plate, and the conductive contact flange are configured so that, when the conductive contact plate is attached to the substrate, the conductive contact plate is electrically connected to the substrate, and the conductive contact flange is electrically connected to a contact pad on the top surface of the housing, enabling current to flow between the substrate and the housing through the conductive contact plate, the conductive spring arm, and the conductive contact flange.

19. The clamp as claimed in claim 17, wherein the conductive spring arm comprises:

a first arm member, integrally attached to the conductive contact plate, which extends from the conductive contact plate in a first direction away from the housing, when the conductive contact plate is attached to the substrate;

a curved member, having a first end that is integrally attached to the first arm member;

a second arm member, integrally attached to a second end of the curved member and the conductive contact flange, which extends from the curved member in a second direction toward the housing and the conductive contact flange, when the conductive contact plate is attached to the substrate.

20. The clamp as claimed in claim 17, wherein a cross sectional area of the clamp is large enough to conduct a current within a range of 100–250 amps without failure.

21. The clamp as claimed in claim 17, wherein the conductive contact plate, the conductive spring arm, and the conductive contact flange include one or more materials selected from a group of materials that includes copper, brass, and steel.

* * * * *